US009538404B2

(12) United States Patent
Seckendorf et al.

(10) Patent No.: US 9,538,404 B2
(45) Date of Patent: *Jan. 3, 2017

(54) APPARATUS AND METHODS FOR PRODUCT ACCEPTANCE TESTING ON A WIRELESS DEVICE

(75) Inventors: Paul M. Seckendorf, San Diego, CA (US); Kenny Fok, San Diego, CA (US); Yousong Mei, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 343 days.

This patent is subject to a terminal disclaimer.

(21) Appl. No.: 13/231,773

(22) Filed: Sep. 13, 2011

(65) Prior Publication Data
US 2012/0035904 A1 Feb. 9, 2012

Related U.S. Application Data

(62) Division of application No. 11/080,228, filed on Mar. 14, 2005, now Pat. No. 8,019,333.

(51) Int. Cl.
*G06F 9/44* (2006.01)
*H04W 24/06* (2009.01)
(Continued)

(52) U.S. Cl.
CPC ............. *H04W 24/06* (2013.01); *B21D 5/00* (2013.01); *B21D 11/20* (2013.01); *B21D 28/10* (2013.01);
(Continued)

(58) Field of Classification Search
CPC ......... H04W 24/06; H04W 16/22; B21D 5/00; B21D 28/10; B21D 11/20; B21D 35/00; E04C 2/08; H05K 5/04; Y10T 428/24314
(Continued)

(56) References Cited

U.S. PATENT DOCUMENTS 5,933,776 A * 8/1999 Kirkpatrick .................. 455/423
6,571,082 B1 * 5/2003 Rahman et al. ........... 455/67.11
(Continued)

FOREIGN PATENT DOCUMENTS

EP 1309214 A1 5/2003
EP 1467583 A1 10/2004
(Continued)

OTHER PUBLICATIONS

"A GSM Digital Radio Communications Test Set," May 1997, Microwave Journal, Horizon House Publications, Norwood, MA, US, pp. 348, 350, 352, XP000737311.
(Continued)

*Primary Examiner* — Dwin M Craig
(74) *Attorney, Agent, or Firm* — James T. Hagler

(57) ABSTRACT

In an embodiment, a product acceptance test application is transmitted by an apparatus across a wireless network to a wireless communications device. The product acceptance test application is configured to be executed by the wireless communications device so as to simulate network communications corresponding to a network communications test scenario. The wireless communications device simulates the network communications using the product acceptance test application and generates product acceptance data which is sent to the apparatus. The apparatus receives the product acceptance data from the wireless communication device indicative of test result data that is based upon the simulated network communications. The apparatus determines a product acceptance decision based on the product acceptance data.

20 Claims, 4 Drawing Sheets

(51) Int. Cl.
*H04W 16/22* (2009.01)
*B21D 5/00* (2006.01)
*B21D 11/20* (2006.01)
*B21D 28/10* (2006.01)
*B21D 35/00* (2006.01)
*E04C 2/08* (2006.01)
*H05K 5/04* (2006.01)

(52) U.S. Cl.
CPC .............. *B21D 35/00* (2013.01); *E04C 2/08* (2013.01); *H04W 16/22* (2013.01); *H05K 5/04* (2013.01); *Y10T 428/24314* (2015.01)

(58) Field of Classification Search
USPC .......................................................... 703/21
See application file for complete search history.

(56) References Cited

U.S. PATENT DOCUMENTS

| | | | | |
|---|---|---|---|---|
| 6,687,500 | B1* | 2/2004 | Causey | 455/423 |
| 6,724,730 | B1* | 4/2004 | Mlinarsky et al. | 370/241 |
| 7,324,815 | B2 | 1/2008 | Ross et al. | |
| 7,539,489 | B1* | 5/2009 | Alexander | 455/423 |
| 8,019,333 | B2* | 9/2011 | Seckendorf | G06Q 10/063 382/149 |
| 2004/0146132 | A1* | 7/2004 | Staszewski et al. | 375/376 |
| 2005/0053008 | A1* | 3/2005 | Griesing et al. | 370/241 |
| 2005/0165919 | A1* | 7/2005 | Qian | H04L 41/0803 709/223 |
| 2005/0226492 | A1 | 10/2005 | Ho | |
| 2006/0235732 | A1 | 10/2006 | Miller et al. | |
| 2007/0283417 | A1 | 12/2007 | Smolen et al. | |
| 2008/0072290 | A1 | 3/2008 | Metzer et al. | |
| 2008/0114567 | A1 | 5/2008 | Jeske et al. | |

FOREIGN PATENT DOCUMENTS

| | | |
|---|---|---|
| GB | 2232850 | 12/1990 |
| JP | H10285252 A | 10/1998 |
| JP | 2002540746 A | 11/2002 |
| JP | 2003124866 A | 4/2003 |
| JP | 2004023755 A | 1/2004 |
| JP | 2004215131 A | 7/2004 |
| WO | WO-0059249 A1 | 10/2000 |

OTHER PUBLICATIONS

International Search Report—PCT/US06/009467, International Searching Authority—European Patent Office, Jul. 19, 2006.
Written Opinion—PCT/US06/009467, International Searching Authority—European Patent Office, Jul. 19, 2006.

* cited by examiner

APPARATUS AND METHODS FOR PRODUCT ACCEPTANCE TESTING ON A WIRELESS DEVICE

CLAIM OF PRIORITY UNDER 35 U.S.C. §120

The present Application for Patent is a divisional of patent application Ser. No. 11/080,228 entitled "APPARATUS AND METHODS FOR PRODUCT ACCEPTANCE TESTING ON A WIRELESS DEVICE" filed Mar. 14, 2005, pending, and assigned to the assignee hereof and hereby expressly incorporated by reference herein in its entirety.

BACKGROUND

The described embodiments generally relate to wireless communications devices and computer networks. More particularly, the described embodiments relate to apparatus and methods of product acceptance testing on a wireless device, and the collection and analysis of product acceptance data from the wireless device.

Wireless networking connects one or more wireless devices to other computer devices without a direct electrical connection, such as a copper wire or optical cable. Wireless devices communicate data, typically in the form of packets, across a wireless or partially wireless computer network and open a "data" or "communication" channel on the network such that the device can send and receive data packets. The wireless devices often have wireless device resources, such as programs and hardware components, which individually use open communication connections to transmit and receive data on the network. In order for the wireless devices to operate on the wireless networks, the devices need to be set-up or configured and then tested, i.e. product acceptance testing. Such set-up or configuration typically includes installing or adjusting various hardware, software and/or firmware and other associated parameters on the wireless device. Further, the set-up or configuration is typically analyzed by running the product acceptance tests on the wireless device to measure the performance and/or operability of the wireless device on the wireless network. Each type of wireless device may have its own device-specific set-up, and each wireless network and/or carrier may also have their network-specific and/or carrier-specific set-ups. Thus, the initial set-up and configuration of a wireless device for operation on a given wireless network is typically very complicated and time consuming.

Another complicating factor in the initial set-up and testing of a wireless device is that typically external testing devices are required. For example, in a wireless device such as a cellular phone, various analyzers are serially connected to the phone and input and/or measure various test parameters. In order to maximize throughput, such testing is typically performed in a batch mode on a plurality of wireless devices, resulting in a confusing mass of external testing devices, cables and wireless devices. Further, typically such tests involve mobile tests, such as driving the cellular phone around a predetermined area to test its receive and transmit capabilities in varying environmental conditions. For example, with a cellular phone, these tests involve an exchange of messaging communications between a base station and the cellular phone. These mobile tests can be very inefficient, as the environmental conditions may not be consistent, as in the case of a change in the weather, and as driving around with the wireless device can be very time-consuming. Further, such mobile testing and the moving around, connecting and disconnecting of the wireless device tend to increase the potential for damaging the wireless device.

Accordingly, it would be advantageous to provide an apparatus and method that allows for less complicated, safer and more consistent product acceptance testing.

BRIEF SUMMARY

An aspect is directed to a wireless communications device, comprising: a computer platform having a simulation module operable to simulate network communications of the wireless communications device on a wireless network, wherein the simulated network communications are associated with a network communications test scenario; and a communications processing engine disposed on the wireless communications device for processing the simulated network communications and generating corresponding product acceptance data for determining compliance of the wireless communications device with a communications processing standard.

Another aspect is directed to an apparatus for analyzing data from a wireless communications device, comprising: a module for receiving product acceptance data corresponding to a processing of a simulated communications message on the wireless communications device, wherein the product acceptance data is associated with a network communications test scenario, wherein the simulated communications message is associated with a communication on a wireless network; and a product acceptance test application executable by the module and including an analysis engine operable to analyze the product acceptance data and generate a product acceptance decision.

Another aspect is directed to a method of performing product acceptance testing, comprising: transmitting at least a portion of a product acceptance test application across a wireless network to a wireless communications device having a communications processing engine, the product acceptance test application including a simulation module for simulating network communications with the communications processing engine, the simulated network communications corresponding to a network communications test scenario; receiving product acceptance data from the wireless communication device, the product acceptance data comprising test result data corresponding to the processing of the simulated network communications by the communications processing engine; and determining a product acceptance decision based on the product acceptance data.

Another aspect is directed to a non-transitory computer readable storage medium containing instructions stored thereon, which, when executed by a wireless device, cause the wireless device to perform operations, the instructions comprising: program code to transmit at least a portion of a product acceptance test application across a wireless network to a wireless communications device having a communications processing engine, the product acceptance test application including a simulation module for simulating network communications with the communications processing engine, the simulated network communications corresponding to a network communications test scenario; program code to receive product acceptance data from the wireless communication device, the product acceptance data comprising test result data corresponding to the processing of the simulated network communications by the communications processing engine; and program code to determine a product acceptance decision based on the product acceptance data.

Another aspect is directed to an apparatus for performing product acceptance testing, comprising: means for transmitting at least a portion of a product acceptance test application across a wireless network to a wireless communications device having a communications processing engine, the product acceptance test application including a simulation module for simulating network communications with the communications processing engine, the simulated network communications corresponding to a network communications test scenario; means for receiving product acceptance data from the wireless communication device, the product acceptance data comprising test result data corresponding to the processing of the simulated network communications by the communications processing engine; and means for determining a product acceptance decision based on the product acceptance data.

Another aspect is directed to an apparatus for product acceptance testing on a wireless device, comprising: means for simulating communications representative of actual communications with a wireless network; and means for processing the simulated communications and thereby generating product acceptance data associated with a product acceptance decision.

BRIEF DESCRIPTION OF THE DRAWINGS

The disclosed embodiments will hereinafter be described in conjunction with the appended drawings provided to illustrate and not to limit the disclosed embodiments, wherein like designations denote like elements, and in which.

DETAILED DESCRIPTION

Figure 1:
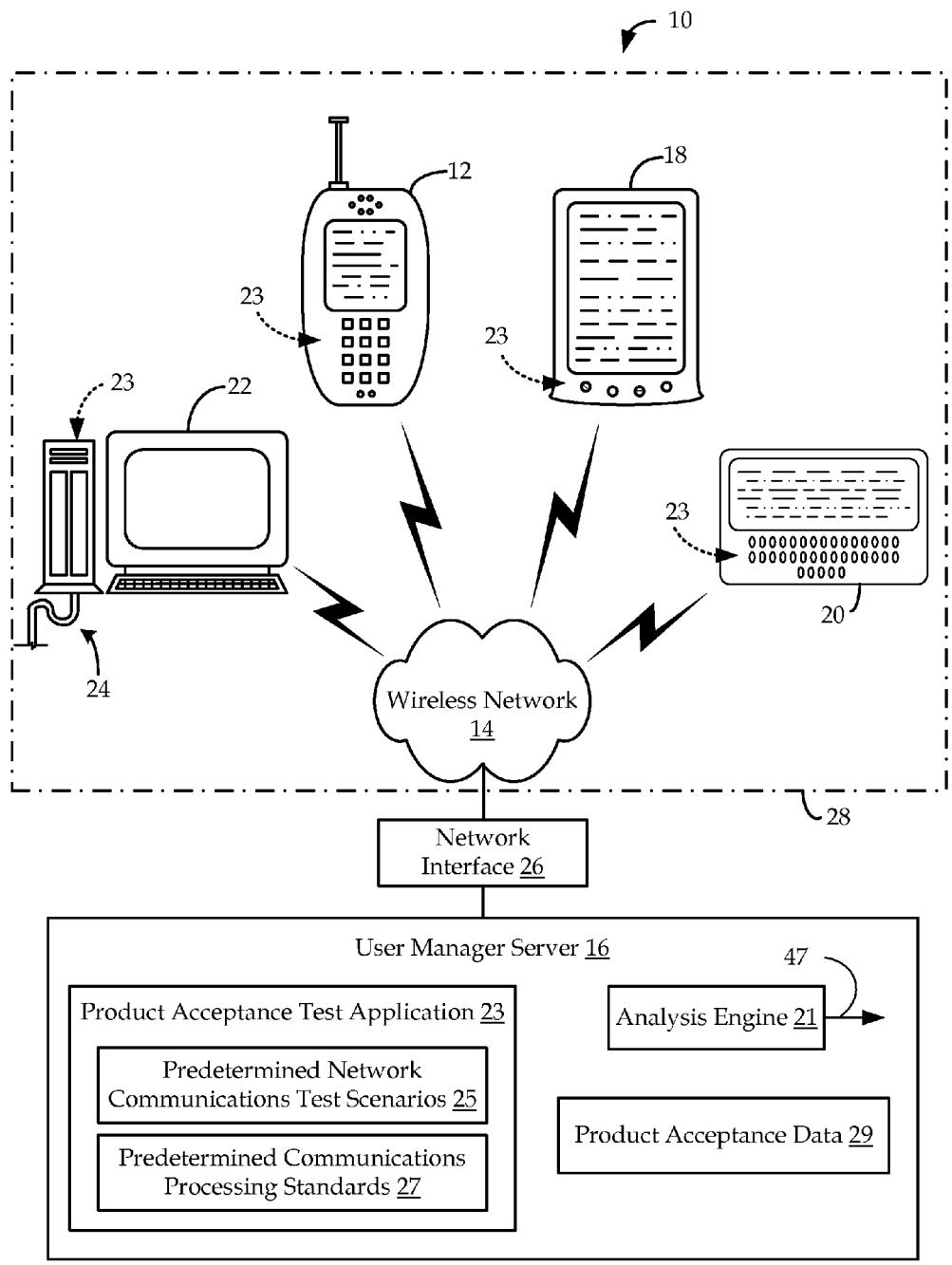
FIG. 1 is a representative diagram of one embodiment of a product acceptance testing apparatus for a wireless device.

Referring to FIG. 1, one embodiment of a product acceptance testing apparatus 10 includes a plurality of wireless devices 12, 18, 20, 22 that each include a product acceptance testing application 23 operable to simulate predetermined network communications test scenarios 25 on the respective device, and to determine if the device is configured and operable according to predetermined communications processing standards 27. For example, such predetermined network communications test scenarios 25 and predetermined communications processing standards 27 include protocols relating to the initiation, maintenance and termination of data communications on the wireless device, thereby establishing operability and performance levels of the device on a network. In one embodiment, wireless devices 12, 18, 20, 22 are positioned within a wireless network area 28 and communicate across a wireless network 14 with each other, and/or with a product acceptance data-gathering and/or user manager server 16. User manager 16 may communicate with wireless devices 12, 18, 20, 22 through a direct, wired connection or through a wireless connection, such as through a network interface 26 in communication with wireless network 14. The communications between user manager 16 and wireless devices 12, 18, 20, 22 may include downloads of all, or selected portions (such as particular test suites), of product acceptance testing application 23. Other such communications include uploads from each wireless device 12, 18, 20, 22 that supply product acceptance data 29, i.e. the test results, back to the user manager 16. Additionally, user manager 16 may include an analysis engine 21 for comparing the received product acceptance data 29 with predetermined communication performance standards 27 to generate a product acceptance decision 47. Alternatively, analysis engine 21 may be associated with product acceptance testing application 23 and may be executable on the respective wireless device 12, 18, 20, 22. It should be noted, however, that due to the simulation capabilities of product acceptance testing application 23, wireless devices 12, 18, 20, 22 advantageously do not need to be in communication with wireless network 14 in order to execute this application and test communications processing ability of the device.

Product acceptance testing application 23 may be initiated at any time, and product acceptance data 29 may be stored on and obtained from the respective wireless device 12, 18, 20, 22 at any time via a wired or wireless connection to the respective wireless device. Product acceptance testing application 23 simulates at least one of a wireless network, a wireless network component, or another device on wireless network and the associated communications/messaging, such as by generating simulated wireless signaling messages. Further, product acceptance test application 23 logs the associated communications processing data, i.e. product acceptance data 29, relevant to determine compliance with predetermined communications processing standards 27. Such product acceptance data 29 is indicative of the wireless device set-up, performance and implementation of the device on the network. As mentioned above, the logged product acceptance data 29 may be stored within the respective wireless device 12, 18, 20, 22 and later uploaded via a wired or wireless connection to user manager 16 for analysis. By eliminating the need during testing for interaction with a wireless network, and by eliminating the need for complicated external cabling and expensive external devices, this solution advantageously reduces the amount of time and resources necessary to run any predetermined network communications test scenario 25 and provide proof of compliance with any predetermined communications processing standard 27. Thus, in one embodiment, product acceptance testing application 23 provides each wireless device 12, 18, 20, 22 with a resident or self-contained capability for simulating communications representative of actual communications with a wireless network and automatically performing product acceptance testing, while user manager 16 analyzes the test results and validates the configuration and operation of the device.

The wireless devices can include any type of computerized, wireless devices, such as cellular telephone 12, personal digital assistant 18, two-way text pager 20, and even a separate computer platform 22 that has a wireless communication portal, and which also may have a wired connection 24 to a network or the Internet. The wireless device can be a remote-slave, or other device that does not have an end-user thereof but simply communicates data across the wireless network 14, such as remote sensors, diagnostic tools, data relays, and the like. The apparatus and method of self-contained product acceptance testing on the wireless device can accordingly be performed on any form of wireless device or computer module including a wired or wireless communication portal, including without limitation, wireless modems, PCMCIA cards, access terminals, personal computers, telephones, or any combination or subcombination thereof.

Figure 2:
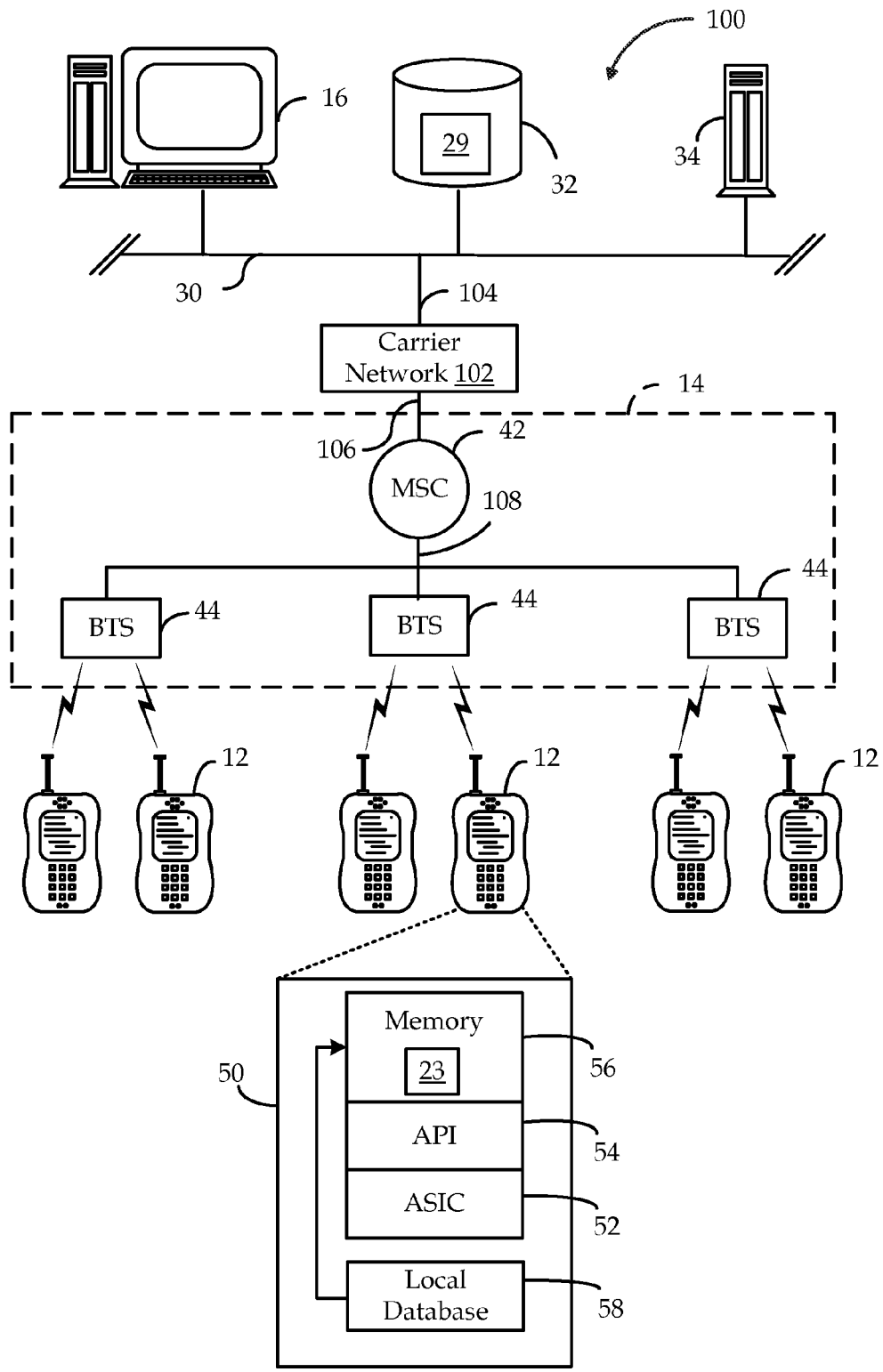
FIG. 2 is a schematic diagram of one embodiment of a cellular telephone network embodiment of the apparatus of FIG. 1, including one embodiment of a computer platform of the wireless device of FIG. 1.

Referring to FIG. 2, each wireless device 12, 18, 20, 22, such as cellular telephone 12 in this case, has a computer platform 50 that can transmit data across wireless network 14, and that can receive and execute software applications and display data transmitted from user manager 16 or another computer device connected to wireless network 14. Computer platform 50 also includes an application-specific integrated circuit ("ASIC") 52, or other chipset, processor, logic circuit, or other data processing device. ASIC 52 or other processor may execute an application programming interface ("API") layer 54 that interfaces with any resident programs, such as product acceptance testing application 23, in a memory 56 of the wireless device. API 54 is a runtime environment executing on the respective wireless device 12, 18, 20, 22. One such runtime environment is Binary Runtime Environment for Wireless® (BREW®) software developed by Qualcomm, Inc., of San Diego, Calif. Other runtime environments may be utilized that, for example, operate to control the execution of applications on wireless computing devices. Memory 56 may include read-only and/or random-access memory (RAM and ROM), EPROM, EEPROM, flash cards, or any memory common to computer platforms. Computer platform 50 also includes a local database 58 that can hold the software applications, files, or data not actively used in memory 56, such as the software applications or data downloaded from user manager 16. Local database 58 typically includes one or more flash memory cells, but can be any secondary or tertiary storage device, such as magnetic media, EPROM, EEPROM, optical media, tape, or soft or hard disk. Additionally, local database 58 can ultimately hold a resident copy of product acceptance application 23 or agent, as is further described herein.

Figure 3:
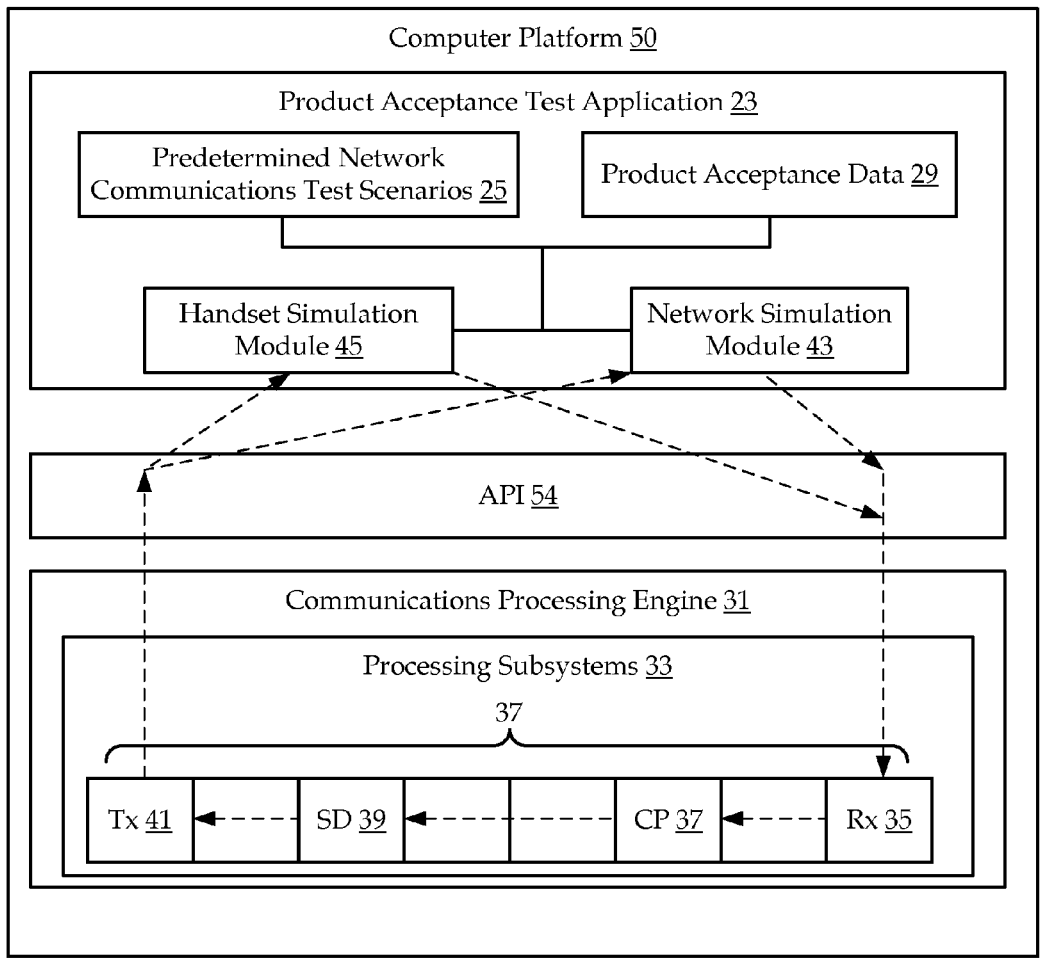
FIG. 3 is one embodiment of an architecture diagram of the interaction between a product acceptance test application and a communications processing engine of the wireless device of FIG. 1.

Referring to FIG. 3, in one embodiment, computer platform 50 includes product acceptance test application 23 that interfaces with API 54 and is executable by a communications processing engine 31. Communications processing engine 31 includes various processing subsystems 33 embodied in hardware, firmware, software, and combinations thereof, that enable the functionality of the respective wireless device 12, 18, 20, 22 and the operability of the respective device on wireless network 14, such as for exchanging data/communications with other devices. For example, communications processing engine 31 may include one or a combination of processing subsystems 33, such as: sound, non-volatile memory, file system, transmit, receive, searcher, physical layer, link layer, call processing layer, main control, remote procedure, handset, power management, diagnostic, digital signal processor, vocoder, messaging, call manager, Bluetooth®, Bluetooth® LPOS, position determination, position engine, user interface, sleep, data services, security, authentication, USIM/SIM, voice services, graphics, USB, camera/camcorder interface and associated display drivers, multimedia such as MPEG, GPRS, etc. In one embodiment, API 54 includes a class of software extensions that allow product acceptance test application 23 to access communications processing engine 31. These software extensions can communicate with processing subsystems 33 on the wireless device, which allows both data reads and commands. For example, this software extension can send commands, including register for log messages, on behalf of the applications that invoke it. The module can then forward the responses of the subsystems to product acceptance test application 23, or ultimately across wireless network 14 to user manager 16. Each resident application on wireless device can create an instance of this new software extension to communicate with the subsystems independently.

In one embodiment, such as a cellular telephone 12, processing subsystems 33 include at least a receive ("Rx") component 35 for receiving communications sent to the processor of the wireless device, at least one call processing ("CP") component 37 and/or system determination ("SD") component 39 for handling the initiation, authentication, handoffs, data exchanges, messaging protocols, internal processing and decision-making, etc. associated with processing a message, and a transmit ("Tx") component 41 for sending communications from the processor of the wireless device, such as to handset components, wireless network 14, wireless network components, and other devices connected to the wireless network. In this embodiment, CP component 37 may handle the majority of the call processing tasks, while SD component 39 may handle tasks relating to selecting an appropriate system, from a plurality of systems, with which to communicate, as well as higher-level decision-making tasks referenced by CP component 37.

In one embodiment, product acceptance test application 23 further includes a network simulation module 43 and a wireless device handset simulation module 45, and one or both of these modules may receive the communications transmitted from Tx component 41 and simulate an appropriate response. During the testing of simulated communication scenarios, product acceptance test application 23 and API 54 provide calls to communications processing engine 31 that prevent Tx component 41 from transmitting over-the-air, and instead direct the transmission to product acceptance test application 23. Network simulation module 43 includes, but is not limited to, a plurality of messages, message protocols and parameters, network characteristics, etc., such as may be associated with predetermined test scenarios 25 and predetermined device/network standards 27 (FIG. 1), in order to simulate a communication of a wireless network, a network component such as a mobile phone base station, or other devices such as a content provider server or a wired network connected to a wireless network, with the respective wireless device 12, 18, 20, 22 and communications processing engine 31. Similarly, wireless device handset simulation module 45 replicates the message protocols and user interactions of a handset, such as sending an SMS message, taking a picture and/or running an application. Wireless handset simulation module 45 includes a plurality of messages, message protocols, handset feature characteristics, etc., such as may be associated with predetermined test scenarios 25 and predetermined device/network standards 27 (FIG. 1), in order to simulate a user interaction and/or a communication of a handset feature and/or component with communications processing engine 31 and/or some other component of the respective wireless device. As such, network simulation module 43 and wireless device handset simulation module 45 may each send communications/messages to Rx component 35, and/or may each receive communications/messages from Tx component 41, to simulate at least some portion of a predetermined network communications test scenario 25. Additionally, the resident product acceptance test application 23 monitors communications processing engine 31 and the various processing subsystems 33 during execution of test scenarios 25, and logs the various parameters, messages, messaging protocols, etc., which define product acceptance data 29. Product acceptance data 29 may then be analyzed, such as by a comparison with predetermined communications standards 27 (FIG. 1), to determine whether or not the wireless device is properly configured and suitably operable.

Predetermined test scenarios 25, which may include a wide range of operational tests, simulated by product acceptance test application 23 may be defined by predetermined communications processing standards 27 (FIG. 1), which may include industry-wide and/or carrier-specific acceptance tests, parameters, messaging protocols, operational criteria and/or associated parameter values indicative of an acceptable or compliant product. For example, in a cellular telephone embodiment, predetermined communications processing standards 27 may include parameters, messaging protocols and other characteristics associated with processing communications on the wireless device. Suitable examples of predetermined communications processing standards 27 include at least one of: CDMA Development Group ("CDG") Stage 2 Interoperability Testing for CDMA2000® Mobiles; CDG Stage 3 Interoperability Testing for CDMA2000® Mobiles; GSM Certification Forum ("GCF") standards; Telecommunication Industry Association ("TIA") standards; $3^{rd}$ Generation Partnership Project ("3GPP") standards; 3GPP2 standards; etc each of which is hereby incorporated by reference. Suitable examples of predetermined test scenarios 25 include at least one of: air interface tests; plain old telephone service ("POTS") tests; handoff tests; power control tests; registration tests; authentication tests, service redirection tests; short messaging service ("SMS") tests; subscriber calling features tests; asynchronous data and fax services tests; low-, medium- and high-speed packet data services tests; voice quality tests; over-the-air services tests; system selection for preferred roaming tests; message driven indicator tests; forward compatibility tests; minimum performance testing; signaling conformance testing; application interface testing; field testing; and data performance testing; etc.

Further, for example, these test scenarios may test the operational performance of various functions, parameters, characteristics, messaging protocols, etc., such as: terminations, originations and maintenance in strong signal, weak signal and mixed signal environments; radio frequency ("RF") performance parameters, such as: receive (Rx) parameters including sensitivity, isolated magnetic dipole ("IMD") and self-jamming, transmit (Tx) parameters such as waveform quality ("Rho"), power control and maximum power, and broadband ("BB") and digital signal processing ("DSP") parameters such as signal acquisition, soft handoff ("SHO"), searcher, and finger assignment; interoperability performance parameters such as: channel parameters including access channel ("ACH"), dedicated paging channel ("DPCH"), forward traffic channel ("FTCH") and reverse traffic channel ("RTCH"), messaging parameters dealing with layer 1 and layer 2, and handoff parameters including SHO, interband hard handoff ("HHO") and interfrequency HHO. Further, for example, these test scenarios may test wireless device feature parameters such as system acquisition, high speed packet data ("HSPD"), location determination, call types (POTS, 3-way, call waiting, voice mail, authentication, etc.), provisioning (over-the-air service provisioning ("OTASP"), over-the-air parameter administration ("OTAPA"), IP over-the-air ("IOTA"), etc.), and other parameters dealing with features such as short message service ("SMS"), multimedia service ("MMS"), browser, Java software and BREWED® software.

Referring back to FIG. 1, wireless network 14 may include at least one, or any combination, of: a cellular telephone network; a terrestrial telephone network; a satellite telephone network; an infrared network such as an Infrared Data Association (IrDA)-based network; a short-range wireless network; a Bluetooth® technology network; a home radio frequency (HomeRF) network; a shared wireless access protocol (SWAP) network; a wideband network, such as a wireless Ethernet compatibility alliance (WECA) network, a wireless fidelity alliance (Wi-Fi Alliance) network, and a 802.11 network; a public switched telephone network; a public heterogeneous communications network, such as the Internet; a private communications network; and land mobile radio network. Suitable examples of telephone networks include at least one, or any combination, of analog and digital networks/technologies, such as: Personal Communications Services, code division multiple access, wideband code division multiple access, universal mobile telecommunications system, advanced mobile phone service, time division multiple access, frequency division multiple access, global system for mobile communication, analog and digital satellite systems, and any other technologies/protocols that may be used in at least one of a wireless communications network and a data communications network.

Network interface 26 may be any mechanism that allows user manager 16 to communicate across wireless network 14. For example, network interface 26 may include a local area network that connects user manager 16 through an Internet Service Provider to the Internet, which in turn may be connected to a respective wireless device through a carrier network and a base station.

In one embodiment, apparatus 10 can "push" at least one product acceptance test application 23 to be resident, at least temporarily, on the computer platform 50 of each wireless device 12, 18, 20, 22. For example, user manager 16 may "push" product acceptance test application 23 across wireless network 14 to the respective device. Alternately, product acceptance test application 23 can be placed on the platform 50 at the time of manufacture or initial programming, or the wireless device 12, 18, 20, 22 can "pull" the application from another computer device on the network, such as user manager 16, either with a request from the end-user, or automatically. Product acceptance data 29 can include, but is not limited to, messages, messaging protocols, and parameters, generated from communications processing engine 31 during the simulated operation of wireless device. Product acceptance data 29 can allow for specific troubleshooting of a device within the wireless network 14 based upon the gathered product acceptance data. As mentioned above, product acceptance application 23 or agent can be permanently stored in the local database 58 of the wireless device computer platform 50, or can only be temporarily held in memory 56 thereof for a one time (or n-time) execution to transmit product acceptance data 29.

Product acceptance test application 23 may cause the respective wireless device to selectively transmit product acceptance data 29 for that wireless device to another computer device, such as user manager 16, on the wireless network. In one embodiment, product acceptance test application 23 transmits product acceptance data 29 from that wireless device 12, 18, 20, 22 to user manager 16 across the wireless network 14 when requested. Alternately, product acceptance test data 29 is transmitted over an open communication connection from the wireless device 12, 18, 20, 22 to the wireless network 14, and thus "piggybacked" across an open connection, such as a voice or data call at the cellular telephone 12. In a cellular network configuration, product acceptance data 29 can be transmitted to user manager 16 through short message service. In another embodiment, a remote user manager 16 reads product acceptance data 29 from the respective device through the resident product acceptance application 23, and in some instances, writes commands to computer platform 50 and alters the operation of the wireless device 12, 18, 20, 22. Accordingly, the access to product acceptance testing application 23 allows user manager 16 to remotely control product acceptance testing and set-up, perform customer interactions, remotely monitor the wireless device, and remotely gather specific product acceptance information.

Referring back to FIG. 1, user manager 16 may be at least one of any type of server, personal computer, mini-mainframes and the like. User manager 16 and its corresponding components can give a ready view of product acceptance data 29 collected from the wireless devices in any form, such as tables, maps, graphics views, plain text, interactive programs or web pages, or any other display or presentation of the data. User manager 16 (or plurality of servers) can send software agents or applications, such as product acceptance test application 23, to wireless devices 12, 18, 20, 22 in the wireless network area 28 such that the wireless devices return data from their resident applications. Wireless devices 12, 18, 20, 22 may transmit data, such as product acceptance data 29, to user manager 16 or some other computer device on the network. User manager 16 utilizes product acceptance data 29 for purposes such as product acceptance testing, product set-up, device diagnosis, and/or data mining. Also, user manager 16 may change an operational parameter and/or configuration of a respective wireless device, and/or of a network component, based on the product acceptance test data 29 and/or based on the analysis and product acceptance test decision 47 generated by analysis engine 21. Further, there can be a separate servers or computer devices associated with user manager 16 that work in concert to provide data in usable formats to parties and/or a separate layer of control in the data flow between the wireless devices 12, 18, 20, 22 and user manager 16.

Additionally, apparatus 10 includes analysis engine 21 that analyzes product acceptance data 29 and generates product acceptance decision 47 as to whether or not the respective wireless device 12, 18, 20, 22 achieves predetermined communications processing standards 27 associated with predetermined network communications scenarios 25. For example, the analysis performed by analysis engine 21 may compare select portions of product acceptance data 29 with select portions of predetermined communications processing standards 27 to see whether or not the data falls within the standards. The selected predetermined communications processing standards 27 may be a minimum value, a maximum value, a range of values, a predetermined value, and combinations thereof. Further, after performing an initial analysis on an initial set of product acceptance test data 29, analysis engine 21 may initiate further communications with one or more wireless devices 12, 18, 20, 22 to retrieve additional data related to product acceptance test data, or to initiate simulation of additional test scenarios 25 and generation of new product acceptance test data. Analysis engine 21 may repeat such a feedback loop until a predetermined solution is achieved, i.e. until a set number of tests are run and the results confirmed. Analysis engine 21 may include hardware, software, firmware, and combinations thereof for analyzing and processing product acceptance data 29. Additionally, analysis engine 21 may further include algorithms, decision-making routines, statistical programs, etc. for analyzing and interpreting product acceptance data 29. Analysis engine 21 may be located anywhere in communication with apparatus 10, such as on user manager 16 or on a respective wireless device 12, 18, 20, 22.

In another embodiment, referring to FIG. 2 for example, apparatus 10 (FIG. 1) may include wireless network 14 connected to a wired network 100 via a carrier network 102. The use of cellular telecommunication pathways has been increasing because wireless devices, such as cellular telephone 12, are being manufactured with increased computing capabilities and are becoming tantamount to personal computers and hand-held personal digital assistants ("PDAs"), communicating packets including voice and data over the wireless network. These "smart" cellular telephones have installed application programming interfaces ("APIs") onto their local computer platform that allow software developers to create software applications that operate on the cellular telephone, and control certain functionality on the device. FIG. 2 is a representative diagram that more fully illustrates the components of a cellular wireless network and interrelation of the elements of one embodiment of the present apparatus. The cellular wireless network is merely exemplary and can include any system whereby remote modules, such as wireless devices 12, 18, 20, 22, communicate over-the-air between and among each other and/or between and among components of a wireless network 14, including, without limitation, wireless network carriers and/or servers. On a LAN network 30, user manager 16 can be in communication with a separate data repository 32 for storing the data gathered from the remote wireless devices 12, 18, 20, 22, such as device product acceptance data 29. Further, a data management server 34 may be in communication with user manager 16 to provide post-processing capabilities, data flow control, etc. Product acceptance data-gathering user manager 16 and, in this embodiment, product acceptance database 32, and data management server 34, may be present on the cellular data network with any other components that are needed to provide cellular telecommunication services. User manager 16, and/or data management server 34 communicate with carrier network 102 through a data link 104, such as the Internet, a secure LAN, WAN, or other network. Carrier network 102 controls messages (generally being data packets) sent to a mobile switching center ("MSC") 42. Further, carrier network 102 communicates with MSC 42 by a network 106, such as the Internet, and/or POTS. Typically, in network 106, a network or Internet portion transfers data, and the POTS portion transfers voice information. MSC 42 may be connected to multiple base stations ("BTS") 44 by another network 108, such as a network and/or Internet portion for data transfer and a POTS portion for voice information. BTS 44 ultimately broadcasts messages wirelessly to the wireless devices, such as cellular telephone 12, by short messaging service ("SMS"), or other over-the-air methods.

Figure 4:
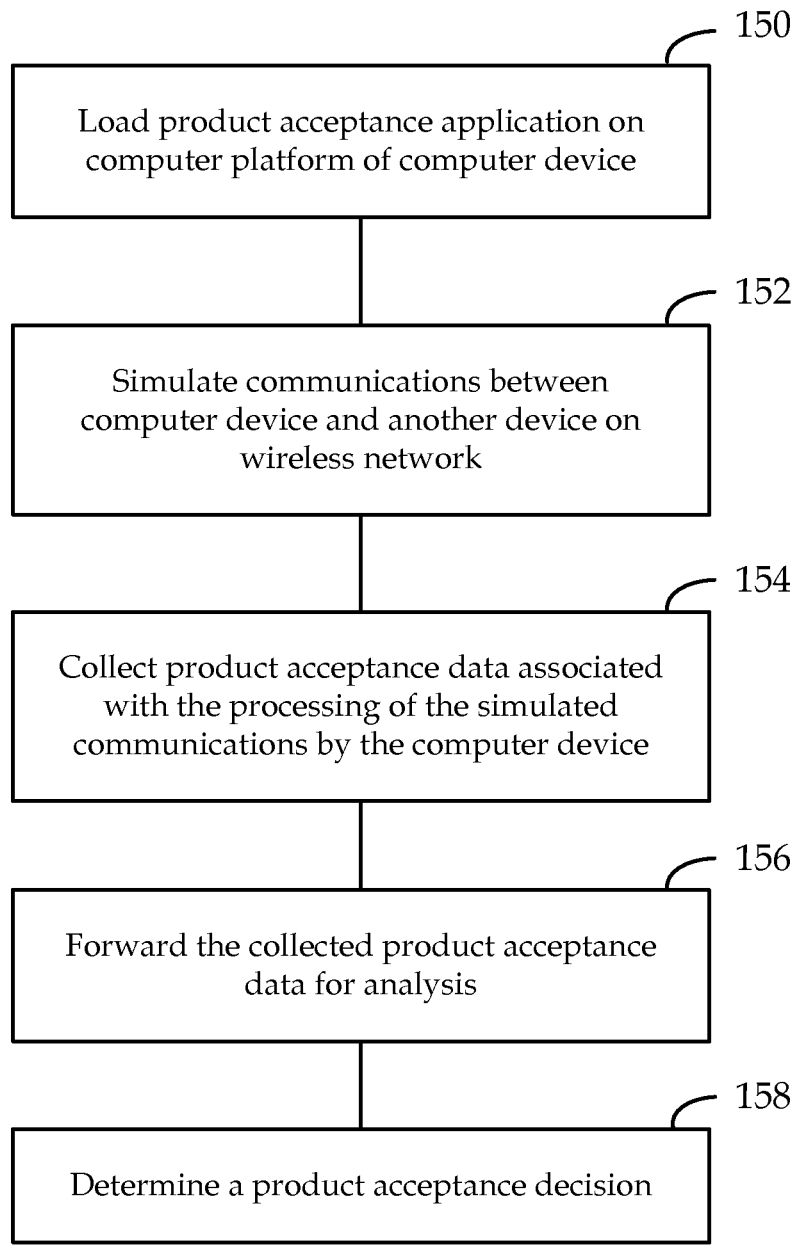
FIG. 4 is a flowchart of one embodiment of a method of product acceptance testing.

In operation, referring to FIG. 4, one embodiment of a method for product acceptance testing on a wireless device includes loading at least a portion of a product acceptance test application onto a computer platform of the wireless device (Block 150). For example, the product acceptance test application may be embodied within the hardware and/or firmware of the wireless device during the manufacture of the device. Alternatively, the product acceptance test application may be "pushed" by a user manager to the wireless device, or "pulled" from a user manager by the wireless device, across a wireless network. In another alternative, the loading of the product acceptance test application may be configurable in any manner, for example, being initiated by a predetermined event, such as failing an associated test.

Further, this embodiment of the method includes simulating communications between the wireless device and another device associated with a wireless communications network (Block 152). For example, the product acceptance test application may include one or more simulation modules, such as a network simulator module and a handset simulator module. Each of these simulator modules may simulate network-specific or external communications and handset-specific or internal device communications, respectively, that are received by a communications processing engine of the wireless device. Further, these simulated communications may be associated with a predetermined network communications test scenario, which may correspond to a predetermined communications processing standard.

This embodiment of the method also includes collecting product acceptance data associated with processing of the simulated communications by the wireless device (Block 154). For example, the product acceptance data is data generated by the communications processing engine of the wireless device during the processing of the simulated communications. The product acceptance test application may execute to cause the product acceptance data to be collected on a memory of the wireless device.

Additionally, the method includes forwarding the collected product acceptance data for analysis to determine a product acceptance decision (Block 156). For example, the collected product acceptance data may be obtained from the communications processing engine and stored in a memory of the wireless device for analysis on the computer platform of the device, or for forwarding across the wireless network for analysis by another computer device, such as a user manger. Further, in one embodiment, the collected product acceptance data is uploaded from the wireless device through a standard HTTP, an FTP or some other data transfer protocol.

Further, this embodiment of the method includes determining the product acceptance decision (Block 158). For example, the product acceptance data may be analyzed by an analysis engine associated with a user manager located across the wireless network from the wireless device. Alternatively, the analysis engine may reside on the wireless device. In one embodiment, the analysis engine may compare selected portions of the product acceptance data with selected portions the predetermined communications processing standards to decide whether or not the data achieves the standard. If the data does achieve the standard, then the product acceptance decision indicates a positive result, i.e. that the wireless device passes the corresponding test or standard. If the data does not achieve the standard, then the product acceptance decision indicates a negative result, i.e. that the wireless device fails the corresponding test or standard. Additionally, the product acceptance decision may be a summary decision based on more than one set of product test data, i.e. if there are a number of test scenarios that need to be run for a given standard. As such, the product acceptance decision may be based on an analysis of a plurality of test results, and a positive result may occur when each of the plurality of tests and/or standards are achieved.

Additionally, it should be noted that the method may include granting access to the product acceptance data to other business or commercial systems. To ensure the security and/or integrity of the collected product acceptance data, such access may be granted in a monitored fashion such as through a user manager. Further, other computer devices, including both storage and processing devices, can be located across the wireless network from the wireless device, and accordingly, the architecture associated with the user manager is readily scalable.

In summary, the apparatus can be implemented solely on the wireless device 12, 18, 20, 22. The wireless device can have at least one application or agent resident (either permanent or temporarily) on the computer platform 50 thereof which causes the gathering of product acceptance data 29 from communications processing engine 31, and which can effect selective transmission of the product acceptance data for that wireless device to another computer device (such as user manager 16) on the wireless network 14. If the wireless device 12, 18, 20, 22 is so embodied, product acceptance data 29 may be transmitted over an open communication connection from the wireless device 12, 18, 20, 22 to the wireless network 14, such as an open voice or data call. If the wireless device is a cellular telephone 12 and the wireless network is a cellular telecommunication network, such as shown in FIG. 2, product acceptance data 29 can be transmitted through short message service or other wireless communication methods.

In view of the method being executable on computer platform 50 of a wireless device 12, 18, 20, 22, the method includes a program resident in a computer readable medium, where the program directs a wireless device 12, 18, 20, 22 having a device platform 50 to perform the steps of the method. Such a program can be executed on any single computer platform, or can be executed in a distributed way among several computer platforms. Furthermore, the method can be implemented by a program that directs a computer device such as user manager 16 to perform a product acceptance determination through gathering and processing product acceptance data 29 from the wireless devices 12, 18, 20, 22.

The computer readable medium can be the memory 56 of the computer platform 50 of the cellular telephone 12, or other wireless device 18, 20, 22, or can be in a local database, such as local database 58 of the device platform 50. Further, the computer readable medium can be in a secondary storage media that is loadable onto a wireless device computer platform, such as a magnetic disk or tape, optical disk, hard disk, flash memory, or other storage media as is known in the art.

Further, the method may be implemented, for example, by operating portion(s) of the wireless network 14 and/or LAN 30, such as device platform 50 and user manager 16, to execute a sequence of machine-readable instructions. The instructions can reside in various types of signal-bearing or data storage primary, secondary, or tertiary media. The media may comprise, for example, RAM (not shown) accessible by, or residing within, the components of the wireless network 14 or LAN 30. Whether contained in RAM, a diskette, or other secondary storage media, the instructions may be stored on a variety of machine-readable data storage media, such as DASD ("direct access storage device") storage (e.g., a conventional "hard drive" or a RAID ("redundant array of independent disks") array), magnetic tape, electronic read-only memory (e.g., ROM, EPROM, or EEPROM), flash memory cards, an optical storage device (e.g. CD-ROM, WORM (write once, read many), DVD, digital optical tape), paper "punch" cards, or other suitable data storage media including digital and analog transmission media.

While the foregoing disclosure shows illustrative embodiments, it should be noted that various changes and modifications could be made herein without departing from the scope of the described embodiments as defined by the appended claims. Furthermore, although elements of the described embodiments may be described or claimed in the singular, the plural is contemplated unless limitation to the singular is explicitly stated.

What is claimed is:

1. A wireless communications device, comprising:
a computer platform having a simulation module configured to simulate network communications of the wireless communications device on a wireless network by transmission of simulated network communications to a receiver of the wireless communications device and/or reception of network communications from a transmitter of the wireless communications device based on the wireless communications device being tested for product acceptance, wherein the simulated network communications are associated with a network communications test scenario; and
a communications processing engine disposed on the wireless communications device configured to process the simulated network communications and/or the received network communications and to generate corresponding product acceptance data for determination of compliance of the wireless communications device with a communications processing standard.

2. The wireless communications device of claim 1, wherein the simulated network communications include at least one of simulated internally-generated messages from a handset component of the wireless communications device or simulated externally-generated messages from a wireless network base station.

3. The wireless communications device of claim 1, further comprising an analysis engine configured to compare the product acceptance data with the communications processing standard and generate a product acceptance decision.

4. The wireless communications device of claim 1, wherein the network communications test scenario is selected from the group consisting of an air interface test, a plain old telephone service test, a handoff test, a power control test, a registration test, an authentication test, a service redirection test, a short messaging service test, a subscriber calling feature test, an asynchronous data test, a fax services test, a packet data service tests, a voice quality test, an over-the-air service test, a system selection for preferred roaming test, a message driven indicator test, a forward compatibility tests, minimum performance testing, signaling conformance testing, application interface testing, field testing or data performance testing.

5. The wireless communications device of claim 1, wherein the product acceptance data is stored at the wireless communications device and selectively transmitted to another computer device across the wireless network.

6. An apparatus for analyzing data from a wireless communications device, comprising:
at least one processor;
at least one memory coupled to the at least one processor, the at least one processor and the at least one memory being configured to receive product acceptance data corresponding to processing of a simulated communications message on the wireless communications device, wherein the product acceptance data is associated with a network communications test scenario, wherein the simulated communications message is associated with a communication on a wireless network, and configured to send simulated network communications to a receiver of the wireless communications device and/or receives network communications from a transmitter of the wireless communications device based on the wireless communications device being tested for product acceptance, and
configured to analyze the product acceptance data and to generate a product acceptance decision.

7. The apparatus of claim 6, wherein the product acceptance decision is based upon a comparison of the product acceptance data with a communications processing standard.

8. The apparatus of claim 7, wherein the product acceptance data is received from an application resident at the wireless communications device that causes a transmission of the product acceptance data from the wireless communications device to the apparatus across the wireless network.

9. The apparatus of claim 7, wherein the apparatus comprises a user manager in communication with the wireless communications device across the wireless network, and wherein the at least one processor and the at least one memory are further configured to request a transmission of the product acceptance data from the wireless communications device.

10. A method of performing product acceptance testing, comprising:
transmitting at least a portion of a product acceptance test application across a wireless network to a wireless communications device having a communications processing engine, the product acceptance test application including a simulation module for simulating network communications with the communications processing engine, the communications processing engine sending simulated network communications to a receiver of the wireless communications device and/or receiving network communications from a transmitter of the wireless communications device based on the wireless communications device being tested for product acceptance, the simulated network communications corresponding to a network communications test scenario;
receiving product acceptance data from the wireless communications device, the product acceptance data comprising test result data corresponding to processing of the simulated network communications and/or the received network communications by the communications processing engine; and
determining a product acceptance decision based on the product acceptance data.

11. The method of claim 10, further comprising initiating the transmitting of at least the portion of the product acceptance test application at the wireless communications device.

12. The method of claim 10, further comprising initiating the transmitting of at least the portion of the product acceptance test application at a user manager device across the wireless network from the wireless communications device.

13. The method of claim 10, further comprising initiating the transmitting of at least the portion of the product acceptance test application based on a given event.

14. The method of claim 10, where determining the product acceptance decision further comprises comparing the product acceptance data with a communications processing standard.

15. The method of claim 14, where the communications processing standard is associated with the network communications test scenario.

16. A non-transitory computer readable storage medium containing instructions stored thereon, which, when executed by a wireless device, cause the wireless device to perform operations, the instructions comprising:

program code to transmit at least a portion of a product acceptance test application across a wireless network to a wireless communications device having a communications processing engine, the product acceptance test application including a simulation module configured to simulate network communications with the communications processing engine, wherein the communications processing engine sends simulated network communications to a receiver of the wireless communications device and/or receives network communications from a transmitter of the wireless communications device based on the wireless communications device being tested for product acceptance, the simulated network communications corresponding to a network communications test scenario;

program code to receive product acceptance data from the wireless communications device, the product acceptance data comprising test result data corresponding to processing of the simulated network communications and/or the received network communications by the communications processing engine; and program code to determine a product acceptance decision based on the product acceptance data.

17. The non-transitory computer readable storage medium of claim 16, where the program code to determine the product acceptance decision further comprises program code to compare the product acceptance data with a communications processing standard.

18. The non-transitory computer readable storage medium of claim 17, where the communications processing standard is associated with the network communications test scenario.

19. An apparatus for performing product acceptance testing, comprising:

means for transmitting at least a portion of a product acceptance test application across a wireless network to a wireless communications device having a communications processing engine, the product acceptance test application including a simulation module configured to simulate network communications with the communications processing engine, wherein the communications processing engine sends simulated network communications to a receiver of the wireless communications device and/or receives network communications from a transmitter of the wireless communications device based on the wireless communications device being tested for product acceptance, the simulated network communications corresponding to a network communications test scenario;

means for receiving product acceptance data from the wireless communications device, the product acceptance data comprising test result data corresponding to processing of the simulated network communications and/or the received network communications by the communications processing engine; and means for determining a product acceptance decision based on the product acceptance data.

20. An apparatus for product acceptance testing on a wireless device, comprising:

means for simulating communications representative of actual communications with a wireless network by transmission of simulated network communications to a receiver of the apparatus and/or reception of network communications from a transmitter of the apparatus based on the apparatus being tested for product acceptance; and means for processing the simulated network communications and generating product acceptance data associated with a product acceptance decision.

\* \* \* \* \*